United States Patent
Banerjee et al.

(10) Patent No.: US 8,299,823 B2
(45) Date of Patent: Oct. 30, 2012

(54) PREVENTING METASTABILITY OF A DIVIDE-BY-TWO QUADRATURE DIVIDER

(75) Inventors: Anirban Banerjee, Essex Junction, VT (US); Paul Scot Carlile, Burlington, VT (US); Zhenrong Jin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 13/010,878

(22) Filed: Jan. 21, 2011

(65) Prior Publication Data

US 2012/0187984 A1     Jul. 26, 2012

(51) Int. Cl.
*H03B 19/00*     (2006.01)
(52) U.S. Cl. ........................ 327/117; 327/115
(58) Field of Classification Search .................. 327/115, 327/117, 254, 255
See application file for complete search history.

(56) References Cited

U.S. PATENT DOCUMENTS

| | | | |
|---|---|---|---|
| 3,930,169 A | 12/1975 | Kuhn, Jr. | |
| 4,181,862 A | 1/1980 | Dingwall | |
| 5,614,869 A | 3/1997 | Bland | |
| 6,049,236 A | 4/2000 | Walden | |
| 6,173,025 B1 | 1/2001 | Jokura | |
| 6,473,476 B1 | 10/2002 | Banks | |
| 6,550,036 B1 | 4/2003 | Panis | |
| 6,566,918 B1 * | 5/2003 | Nguyen | 327/115 |
| 7,236,040 B2 | 6/2007 | Chan et al. | |
| 7,403,048 B2 * | 7/2008 | Heidari et al. | 327/117 |
| 7,425,850 B2 | 9/2008 | Widerin | |
| 7,508,273 B2 | 3/2009 | Redman-White | |

\* cited by examiner

*Primary Examiner* — Hai L Nguyen
(74) *Attorney, Agent, or Firm* — Abdul-Samad A. Adediran; David Cain

(57) ABSTRACT

Embodiments of the present invention provide an approach for receiving true and complement clock signals at high or low frequencies into inputs of a divide-by-two quadrature divider, and providing true and complement clock signals, which are one-half the measured frequencies of the clock input signals, at the output of the quadrature divider. A tri-state clock mux coupled with combinatorial reset logic, with pull-up and pull-down devices at the output of the tri-sate clock mux, and/or pull-up and pull-down devices between the quadrature divider latches provide a defined logic state during startup at the input of the quadrature divider. The defined logic state ensures the output of the quadrature divider is metastability-free during high frequency application. Specifically, the quadrature divider has two output clock signals that are true and complement with measured frequencies that are one-half of the measured frequencies of the two clock input signals coming into the quadrature divider.

19 Claims, 14 Drawing Sheets

PREVENTING METASTABILITY OF A DIVIDE-BY-TWO QUADRATURE DIVIDER

TECHNICAL FIELD

The present invention relates generally to a divide-by-two quadrature divider circuit, and more particularly to metastability-free high frequency divide-by-two quadrature divider circuit with selectable input clocks.

BACKGROUND

Divide-by-two quadrature divider circuits are generally used to divide down a high frequency signal generated by a high speed phased-locked loop ("PLL"). PLL devices receive external low frequency clock input signals and utilize those signals to generate high frequency signals. Under normal conditions, the divide-by-two quadrature divider can take true and complement clock signals (i.e. wherein a true signal is transitioning from low to high and a complement signal is transitioning from high to low) as inputs, and provide a first and second pair of true and complement clock signals at the quadrature divider's outputs, wherein the first pair and second pair provide one-half the input frequency of the quadrature divider, and wherein the second pair has a 90 degree phase difference with respect to the first pair.

However, a divide-by-two quadrature divider circuit is susceptible to metastability when operating with high frequency signals. Specifically, current design topology for a divide-by-two quadrature divider, utilized in dividing down PLL output frequency, can result in the output of the divide-by-two quadrature divider entering into and remaining in a metastable state. Generally, metastability at the output of the divide-by-two quadrature divider occurs during startup or initial settling time while the PLL is operating at high frequency application (for example, when PLL output frequency is greater than approximately 25 GHz). A divide-by-two quadrature divider will receive a pair of clock input signals at a given frequency at its input, and generate a first and second pair of output signals that are one-half the frequency of the clock input signals' frequency. Moreover, the second pair of output signals will have a 90 degree phase difference with respect to the first pair of output signals. However, when metastability occurs the divide-by-two quadrature divider's output signals will not reach rail-to-rail (i.e. reach Vdd or Vss), the output signals will not be true and complement, and the output signals will not have the expected phase differences with respect to the clock input signals. An object of the present invention is to resolve such metastability with minimal impact on circuit topology and on power consumption.

SUMMARY

The present invention resides in a phased-locked loop ("PLL") circuit, and generates a metastability-free output of a divide-by-two quadrature divider with minimal impact on power consumption and on circuit topology, comprising combinatorial logic with reset, a tri-state clock mux, and pull-up and pull-down devices operatively coupled with a divide-by-two quadrature divider.

A first aspect of the present invention provides an integrated circuit comprising: a reset input and one or more mux select inputs; a combinatorial reset logic comprising one or more inputs and one or more outputs, wherein the one or more inputs of the combinatorial reset logic are operatively coupled with the reset input and with the one or more mux select inputs; a tri-state clock mux with a first pair of inputs, a second pair of inputs, a first output, and a second output, wherein the tri-state clock mux is operatively coupled with the one or more outputs of the combinatorial reset logic; a divide-by-two quadrature divider comprising one or more outputs, a first clock input pair, a second clock input pair, a first latch with outputs and data inputs, and a second latch with outputs and data inputs, wherein the divide-by-two quadrature divider first and second clock input pairs are operatively coupled with the tri-state clock mux first and second outputs, respectively; and a pull-up device and a pull-down device, wherein the pull-up and pull-down devices are operatively coupled with the tri-state clock mux first and second outputs respectively, and wherein the pull-up and pull-down devices are operatively coupled with the first and second clock input pairs of the divide-by-two quadrature divider.

A second aspect of the present invention provides a method for generating a metastability-free output of a divide-by-two quadrature divider circuit, the method comprising the steps of: receiving one or more source signals at one or more inputs of combinatorial logic gates; detecting a frequency of the one or more source signals; asserting reset input when a circuit is powered up and the frequency of at least one of the source signals exceeds a predetermined level; utilizing the reset input and combinatorial logic gates to hold the source signals at the input into a second circuit, and preventing the source signals to pass to the outputs of the second circuit; generating a defined state at an input of a subsequent circuit; receiving the defined state into the subsequent circuit from the output of the second circuit; generating a defined state at an output to the subsequent circuit; de-asserting the reset input after a predetermined amount of time has elapsed; utilizing the reset input and combinatorial logic to release at least one of the source signals at the input into the second circuit, and allowing the source signal to pass to the outputs of the second circuit; receiving the source signals from the outputs of the second circuit into the input of the subsequent circuit; and generating a metastability-free output at the output of the subsequent circuit.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
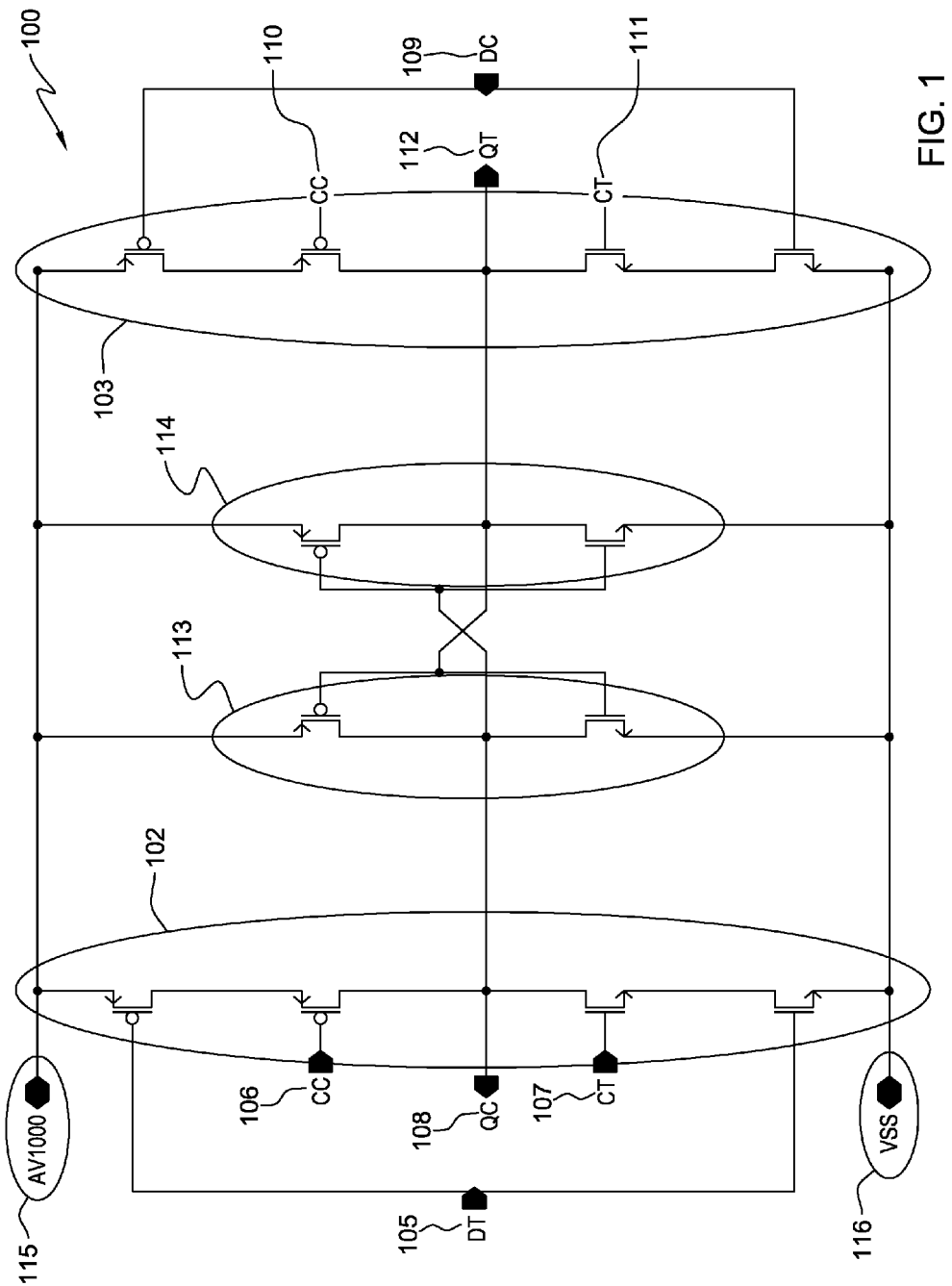
FIG. 1 is a schematic of one embodiment of a single latch within a divide-by-two quadrature divider.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention generate a metastability-free output of a divide-by-two quadrature divider with minimal impact on circuit topology and on power consumption. Embodiments of the present invention comprising combinatorial reset logic, and a tri-state clock mux operatively coupled with pull-up and pull-down devices and a divide-by-two quadrature divider are provided.

Referring now to FIG. 1, a schematic depicting current topology of a latch 100 within a divide-by-two quadrature divider is illustrated. The latch 100, includes stacked inverter 102 with inputs 105-107, and with an output 108 connected to the output of inverter 113 and to the input of inverter 114. Moreover, latch 100 includes stacked inverter 103 with inputs 109-111, and with an output 112 connected to the output of inverter 114 and to the input of inverter 113, and wherein inverter 113 and inverter 114 are operatively coupled back to back. Inverters 113 and 114, also referred to as cross-coupled inverters, have a weak drive strength compared to the drive strengths of the stacked inverters 102 and 103. In latch mode, inverters 113 and 114 will try to amplify the small voltage difference between outputs 108 and 112. Specifically, when the clock input frequency is low the inverters 113-114 (i.e. crossed-coupled pair) have enough time to amplify the small voltage difference between outputs 108 and 112, wherein one of the outputs 108 or 112 will be amplified to Vdd 115 (i.e. logic high) and the other of the outputs 108 or 112, not amplified to Vdd 115, will be amplified to Vss 116 (i.e. logic low). However, during PLL power on or during initial settling time, if both inputs 105 and 109 are at logic high, then both outputs 108 and 112 will be at logic low, or if both inputs 105 and 109 are at logic low, then both outputs 108 and 112 will be at logic high. When both outputs 108 and 112 are both at logic high or are both at logic low, then cross-coupled inverters 113 and 114 may enter and remain in a metastable state. Moreover, when outputs 108 and 112 are both at logic high or both at logic low, the latch 100 is said to be in a metastable state. The metastability generally happens during startup or initial settling time of latch 100 while latch 100 is operating with high frequency clock input signals which are being propagated at a frequency greater than approximately 25 GHz. When clock input frequency is greater than 25 GHz, cross-coupled inverters 113-114 cannot amplify the small voltage difference between outputs 108 and 112 to Vdd 115 and Vss 116 within one clock cycle. Accordingly, the latch 100 will enter and may remain in a metastable state.

Figure 2:
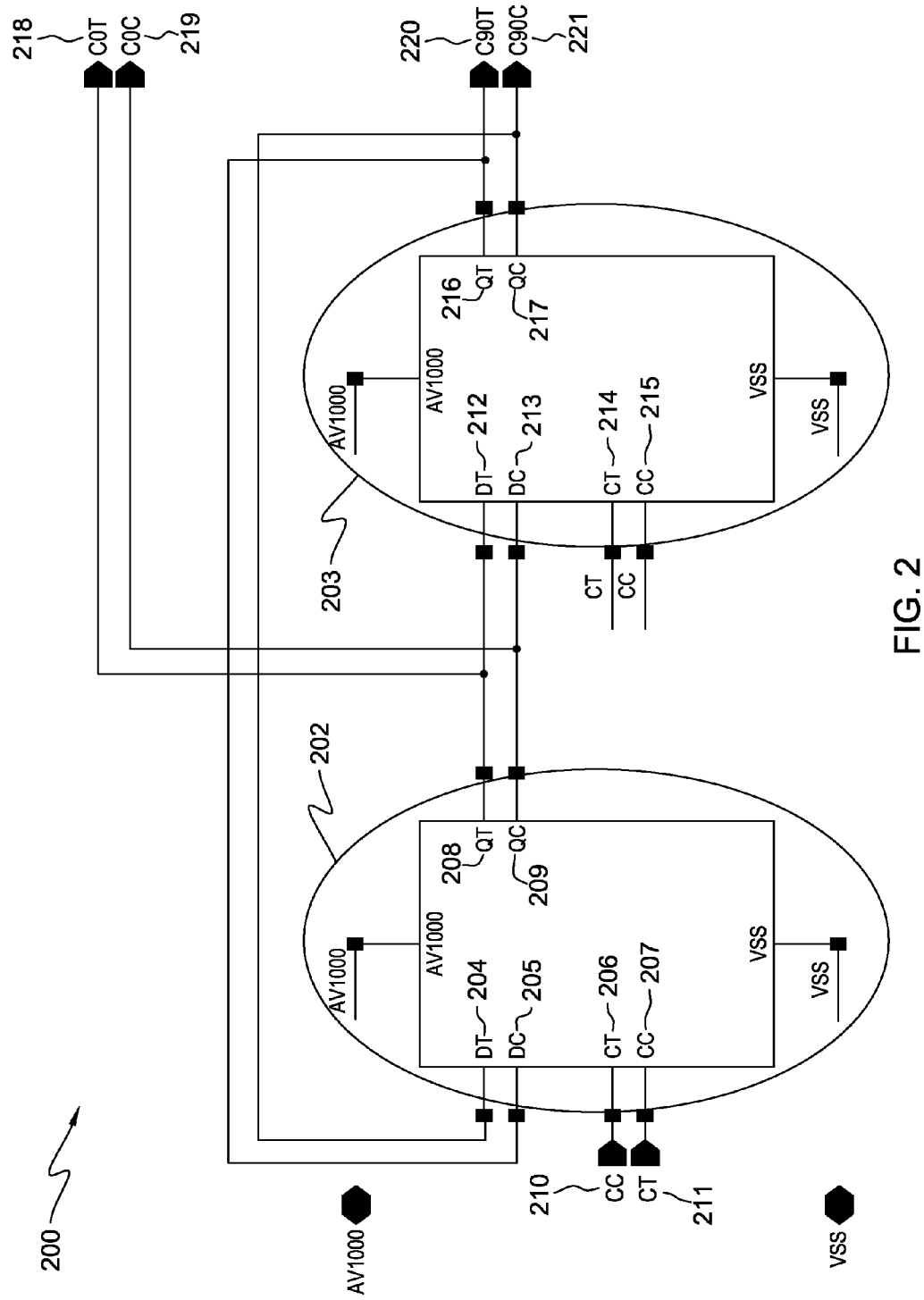
FIG. 2 is a schematic of one embodiment of the divide-by-two quadrature divider, which comprises two of the single latch depicted in FIG. 1.

Referring now to FIG. 2, a schematic depicting current topology of a divide-by-two quadrature divider 200 is illustrated. The quadrature divider 200 comprises a first latch 202 and a second latch 203. The first latch 202, has data inputs 204-205, clock inputs 206-207, and outputs 208-209. A complement clock input signal 210 is received at input 206, and a true clock input signal 211 is received at input 207. A true clock output signal 218 and a complement clock output signal 219, both with a frequency of one-half the frequency of input signals 210-211 are expected to be generated at outputs 208-209, respectively. The second latch 203, has data inputs 212-213, clock inputs 214-215, and outputs 216-217. The complement clock input signal 210 is received at input 215, and true clock input signal 211 is received at input 214, wherein inputs 206-207 and inputs 214-215 receive the same clock input signals 210-211, but wherein inputs 206-207 have an opposite polarity with respect to inputs 214-215. A true clock output signal 220 and a complement clock output signal 221, both with a frequency of one-half the frequency of the clock input signals 210-211, are expected to be generated at outputs 216-217, respectively. In addition, true and complement clock output signals 220-221 will have a phase difference of 90 degrees with respect to true and complement clock output signals 218-219.

Figure 3A:
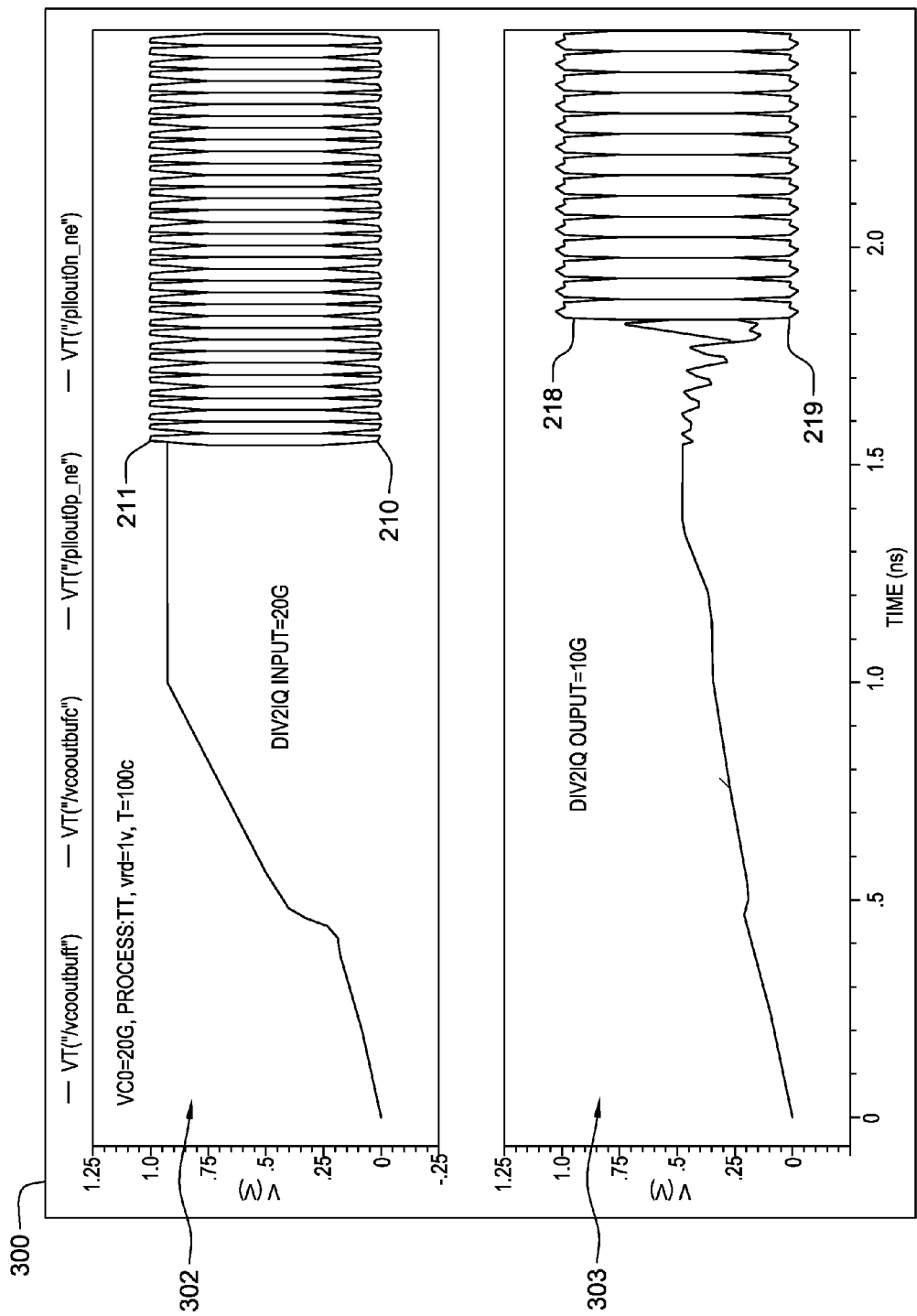
FIGS. 3A-3E are timed simulation diagrams depicting the waveform of clock input signals, with frequencies at 20-28 GHz, received into the divide-by-two quadrature divider of FIG. 2, and depicting the waveform of output signals from the divide-by-two quadrature divider.

Referring now to FIG. 3A, a timed simulation diagram 300 (at 1.0 Volt and 100° C.) depicting a top waveform 302 of the clock input signals 210-211 (also shown in FIG. 2) received at inputs 206-207 and 214-215 (shown in FIG. 2) of the divide-by-two quadrature divider 200 (shown in FIG. 2) is illustrated. As the PLL comprising the divide-by-two quadrature divider 200 is powered on, the top waveform 302 shows clock input signals 210-211, with a frequency of 20 GHz starting from 0 volts (i.e. Vss) and gradually ramping up to 1.0 volt (i.e. Vdd). Shortly, after 1.5 nanoseconds has elapsed clock input signals 210-211 reach rail to rail (i.e. reach Vdd or Vss) and start to oscillate at a frequency of 20 GHz.

Also illustrated in FIG. 3A, is bottom waveform 303 of the output clock signals 218-219 (shown in FIG. 2) generated at outputs 208-209, of the divide-by-two quadrature divider 200. Waveform 303 indicates the divide-by-two quadrature divider 200 is functioning correctly with clock input signals 210-211 oscillating at a frequency of 20 GHz. Specifically, once the PLL comprising the divide-by-two quadrature divider 200 is fully powered on and after approximately 1.9 nanoseconds has elapsed, true and complement clock output signals 218-219 reach rail to rail and oscillate at a frequency of 10 GHz (i.e. one-half the frequency of clock input signals 210-211).

Figure 3B:
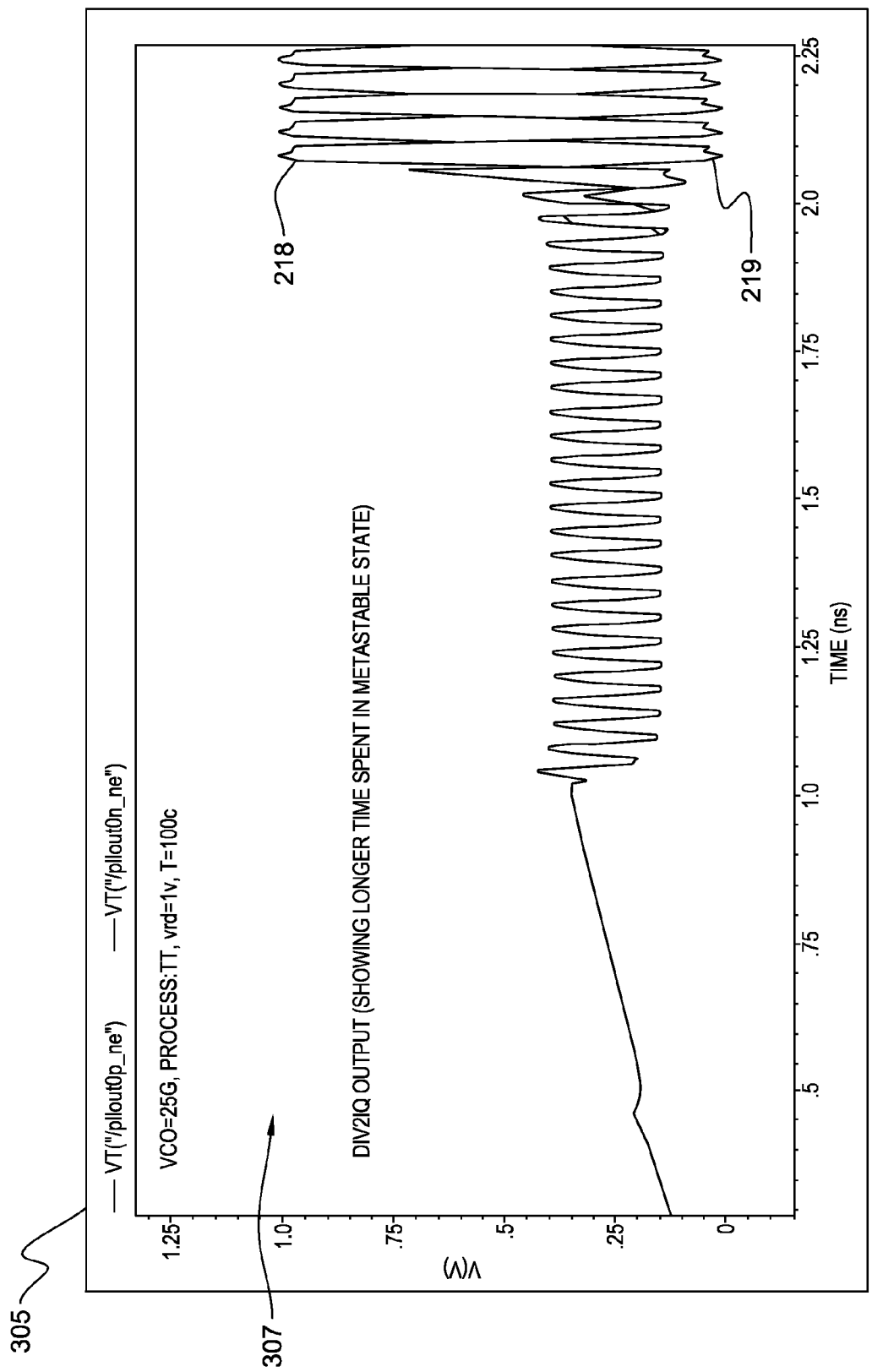

FIG. 3B illustrates a timed simulation diagram 305 (at 1.0 Volt and 100° C.) depicting a waveform 307 of the output clock signals 218-219 (shown in FIG. 2), wherein the simulated clock input signal frequency is now 25 GHz. Waveform 307 shows that the divide-by-two quadrature divider 200 (shown in FIG. 2) has spent some time in an unstable state. Specifically, the true and complement clock out signals 218-219 (shown in FIG. 2) were unable to reach rail to rail for approximately 2.0 nanoseconds, wherein the clock signal swing was approximately 250 millivolts. In addition, waveform 307 also indicates that the true and complement clock output signals 218-219 are in phase for about 2.0 nanoseconds. Shortly after 2.0 nanoseconds has elapsed, output signals 218-219 reach rail to rail and oscillate at a frequency of 12.5 GHz (i.e. one-half the frequency of the clock input signals). Thus, output waveform 303 (shown in FIG. 3A) and output waveform 307 indicate that the duration of time the quadrature divider 200 spends in the unstable state increases as the frequency of clock input signals 210-211 (shown in FIG. 2) increases.

Figure 3C:
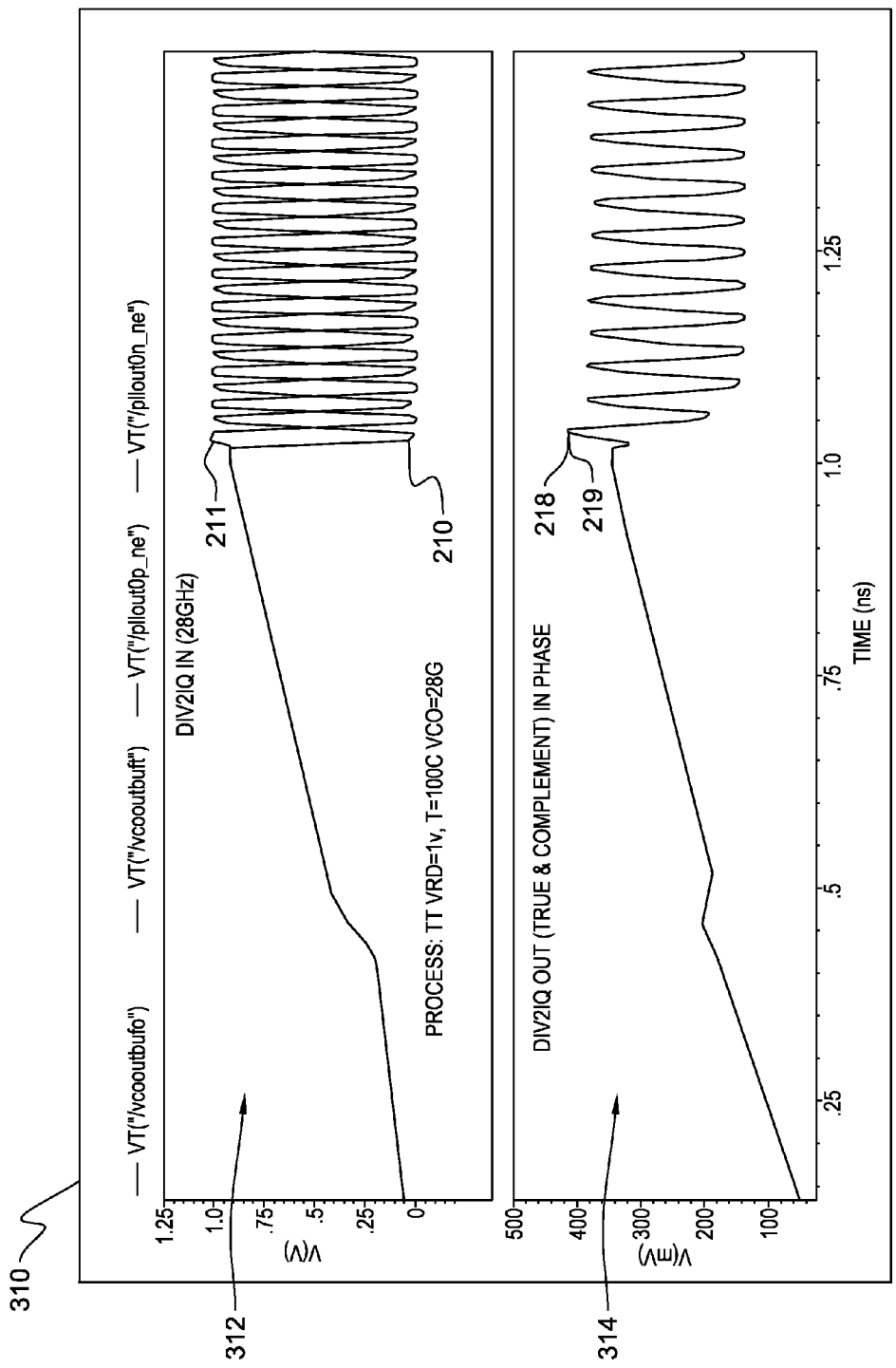

FIG. 3C illustrates a timed simulation diagram 310 (at 1.0 Volt and 100° C.) depicting a top waveform 312 of the clock input signals 210-211 (also shown in FIG. 2) received at inputs 206-207 and 214-215 (shown in FIG. 2) of the divide-by-two quadrature divider 200 (shown in FIG. 2). As the PLL comprising the divide-by-two quadrature divider 200 is powered on, the top waveform 312 shows that clock input signals 210-211 oscillate at 28 GHz.

Also illustrated in FIG. 3C, is bottom waveform 314 of the clock output signals 218-219 (shown in FIG. 2) generated at outputs 208-209 (shown in FIG. 2) of the divide-by-two quadrature divider 200. As the PLL comprising the divide-by-two quadrature divider is fully powered on, the true and complement clock output signals 218-219 are in phase and do not reach rail to rail (i.e. Vdd or Vss). This indicates that the divide-by-two quadrature divider 200 is in a metastable state and is unable to come out of the metastable state, wherein the frequency of the clock input signal is 28 GHz.

Figure 3D:
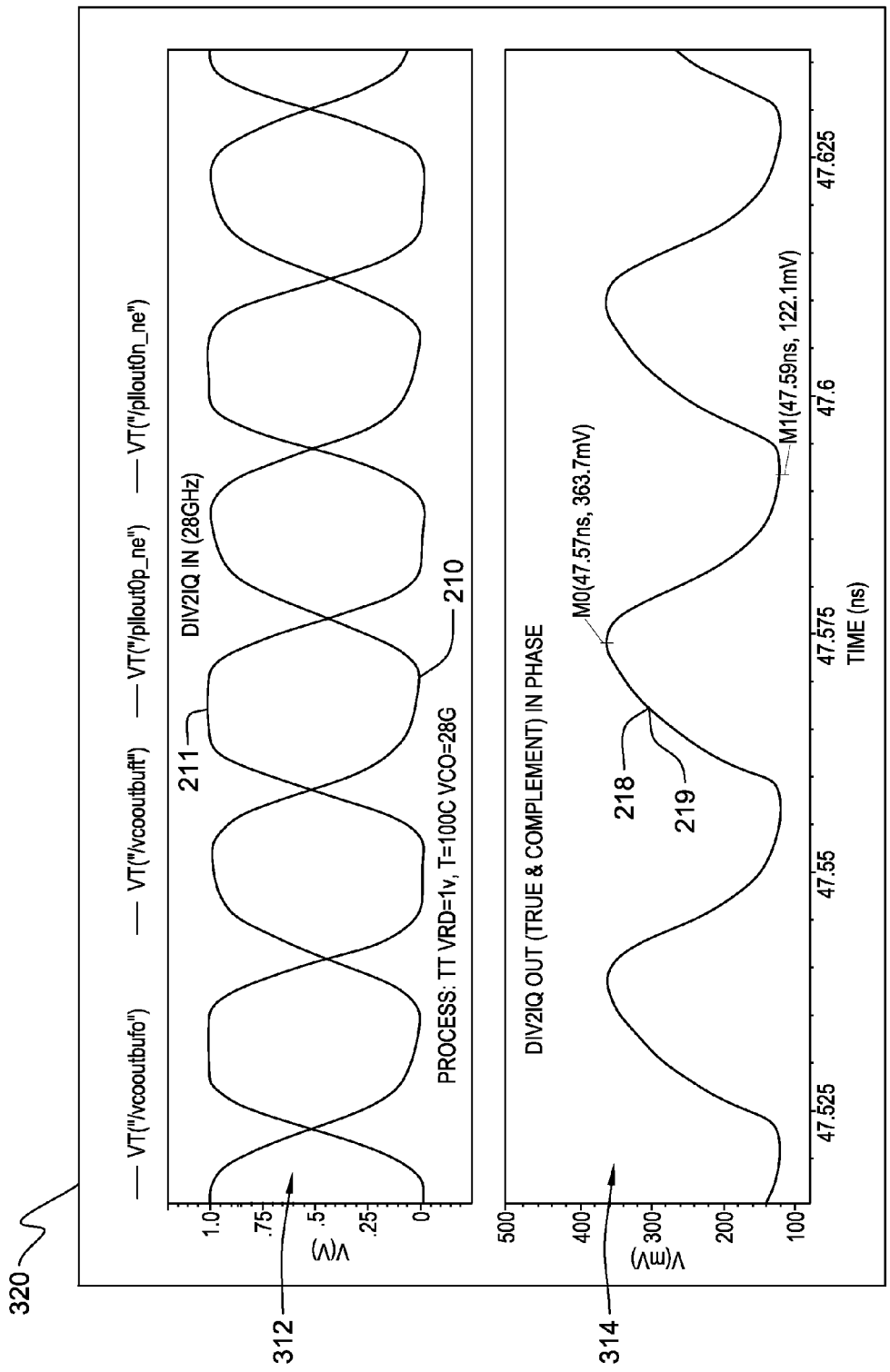

FIG. 3D illustrates a timed simulation diagram 320 (at 1.0 Volt and 100° C.) depicting a top waveform 312 (also shown in FIG. 3C) of the clock input signals 210-211 (also shown in FIG. 3C) received at inputs 206-207 and 214-215 (shown in FIG. 2) of the divide-by-two quadrature divider 200 (shown in FIG. 2). FIG. 3D depicts the same waveforms as FIG. 3C, but at a later point in time between approximately 47.52 nanoseconds and 47.63 nanoseconds. Thus, top waveform 312 shows the true and complement clock input signals 210-211 oscillating at 28 GHz. However, bottom waveform 314 (also shown in FIG. 3C) shows that clock output signals 218-219 (also shown in FIG. 3C) still have a very small signal swing of approximately 240 millivolts around 47.57 nanoseconds. In addition, waveform 314 shows that true and complement clock output signals 218-219 are in phase with each other and are transitioning in the same direction. Accordingly, the divide-by-two quadrature divider 200 still remains in a metastable state and is unable to get out of the metastable state.

Figure 3E:
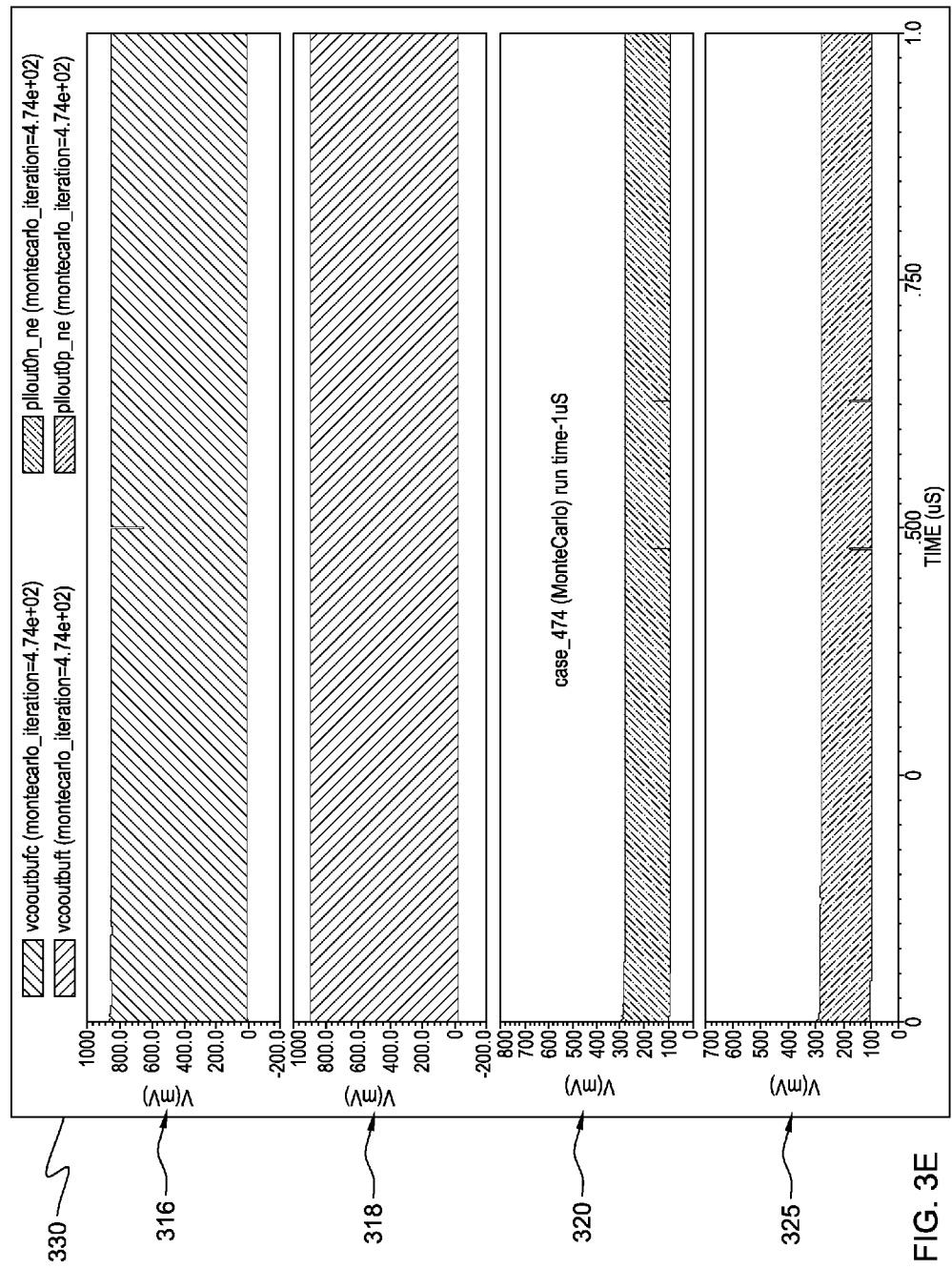

FIG. 3E illustrates a timed simulation diagram 330 (at 0.88 Volts and 130° C.) depicting the results of the MonteCarlo simulations for 1.0 microsecond wherein clock input frequency is 28 GHz. Waveforms 318 and 316 depict the true and complement clock input signals 211 and 210 (shown in FIG. 2), respectively. The waveforms 320 and 325 depicts the true and complement clock output signals 218 and 219 (shown in FIG. 2), respectively. FIG. 3E indicates that the true and complement clock output signals 218-219 have a signal swing of approximately 200 millivolts from 0 to 1.0 microsecond. In addition, FIG. 3E also indicates that true and complement clock output signals 218-219 are in phase and are transitioning in the same direction for 1.0 microsecond. The MonteCarlo simulation indicates that the divide-by-two quadrature divider 200 (shown in FIG. 2) has entered and remained in a metastable state for 1.0 microsecond and cannot get out of the metastable state.

Figure 4A:
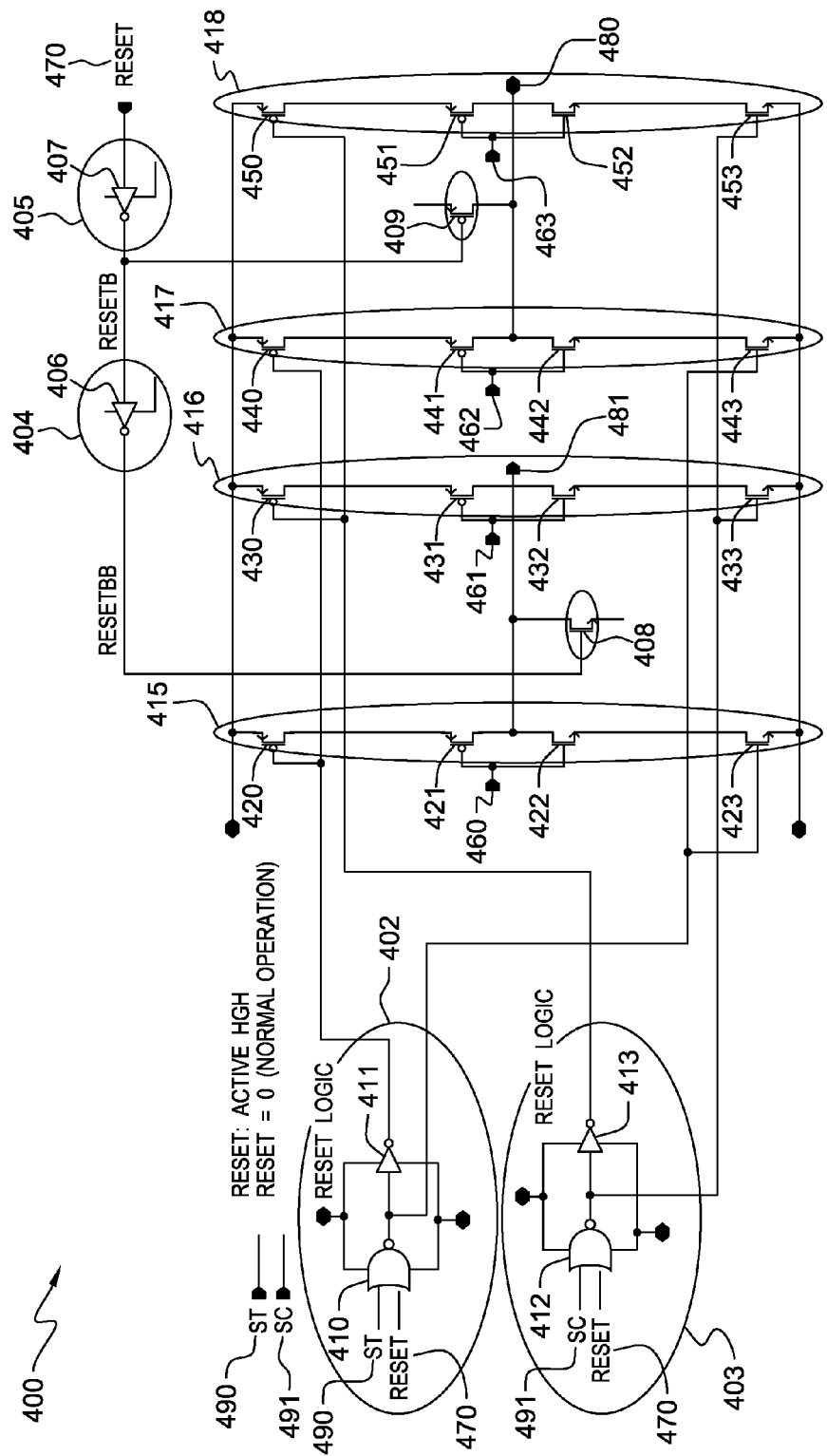
FIGS. 4A-4B are schematics of one embodiment of combinatorial reset logic, and tri-state clock mux with pull-up and pull-down devices operatively coupled to the divide-by-two quadrature divider of FIG. 2.

FIG. 4A illustrates a schematic depicting one embodiment of the combinatorial reset logic and tri-state clock mux with pull-up and pull-down devices 400 operatively coupled to establish defined states at tri-state clock mux outputs 480-481. The combinatorial reset logic and tri-state clock mux, prevent a divide-by-two quadrature divider from remaining in a metastable state at startup or initial settling time when high frequency clock input signals are received at inputs into the tri-state clock mux.

The combinatorial reset logic comprises circuit components 402-405. Circuit components 402 and 403 comprise combinatorial logic gates 410-411 and combinatorial logic gates 412-413, respectively. Combinatorial logic gate 410 comprises clock mux select input 490 and reset input 470, wherein reset input 470 can be implemented asynchronously. Combinatorial logic gate 412 comprises clock mux select input 491 and reset input 470. Circuit components 404 and 405 comprise combinatorial logic gates 406 and 407, respectively. Moreover, the outputs of components 404 and 405 are operatively coupled to a n-fet pull-down device 408 and to a p-fet pull-up device 409, respectively.

The tri-state clock mux comprises four circuit components 415-418. Circuit component 415, with input 460, comprises two p-fet devices 420-421 and two n-fet devices 422-423. Circuit component 416, with input 461, comprises two p-fet devices 430-431 and two n-fet devices 432-433. Circuit component 417, with input 462, comprises two p-fet devices 440-441 and two n-fet devices 442-443. Circuit component 418, with input 463, comprises two p-fet devices 450-451 and two n-fet devices 452-453. In addition, the tri-state clock mux comprises outputs 480-481.

The combinatorial reset logic components 402-405 are operatively coupled with the tri-state clock mux. Specifically, the output of combinatorial logic gate 410 is connected to the gate of n-fet devices 423 and 443. The output of combinatorial logic gate 411 is connected to the gate of p-fet devices 420 and 440. The output of combinatorial logic gate 412 is connected to the gate of n-fet devices 433 and 453. The output of combinatorial logic gate 413 is connected to the gate of p-fet devices 430 and 450. Combinatorial logic gate 407 has reset input 470 as an input, wherein the output of combinatorial logic gate 407 is connected to the input of combinatorial logic gate 406 and to the gate of p-fet pull-up device 409. Furthermore, the output of combinatorial logic gate 406 is connected to the gate of pull-down n-fet device 408.

As shown in FIG. 4A, logic gates 410 and 412 have mux select inputs ST 490 and SC 491, respectively. Mux select inputs ST 490 and SC 491 determine input clock selection from two different clock sources, either true and complement clock input signal pair at inputs 460 and 462, or true and complement clock input signal pair at inputs 461 and 463. Furthermore, mux select inputs ST 490 and SC 491 determine which two of the circuit components 415-418 will be turned on. When reset input 470 is asserted (i.e. at logic high), the entire tri-state clock mux is tri-stated and all four circuit components 415-418 are turned off. When the circuit components 415-418 are turned off, the clock input signals are received at inputs 460-463, but cannot pass through the tri-state clock mux to outputs 480-481. In addition, when reset input 470 is asserted, output 480 is pulled to Vdd by pull-up device 409, and output 481 is pulled to Vss by pull-down device 408. As a result, when reset input 470 is asserted the outputs 480-481 of the tri-state clock mux will provide a defined logic high and logic low state for true and complement clock inputs of a divide-by-two quadrature divider circuit. When reset input 470 is de-asserted, the tri-state clock mux will select and pass one of the true and complement clock input signal pair to the outputs 480-481.

Figure 4B:
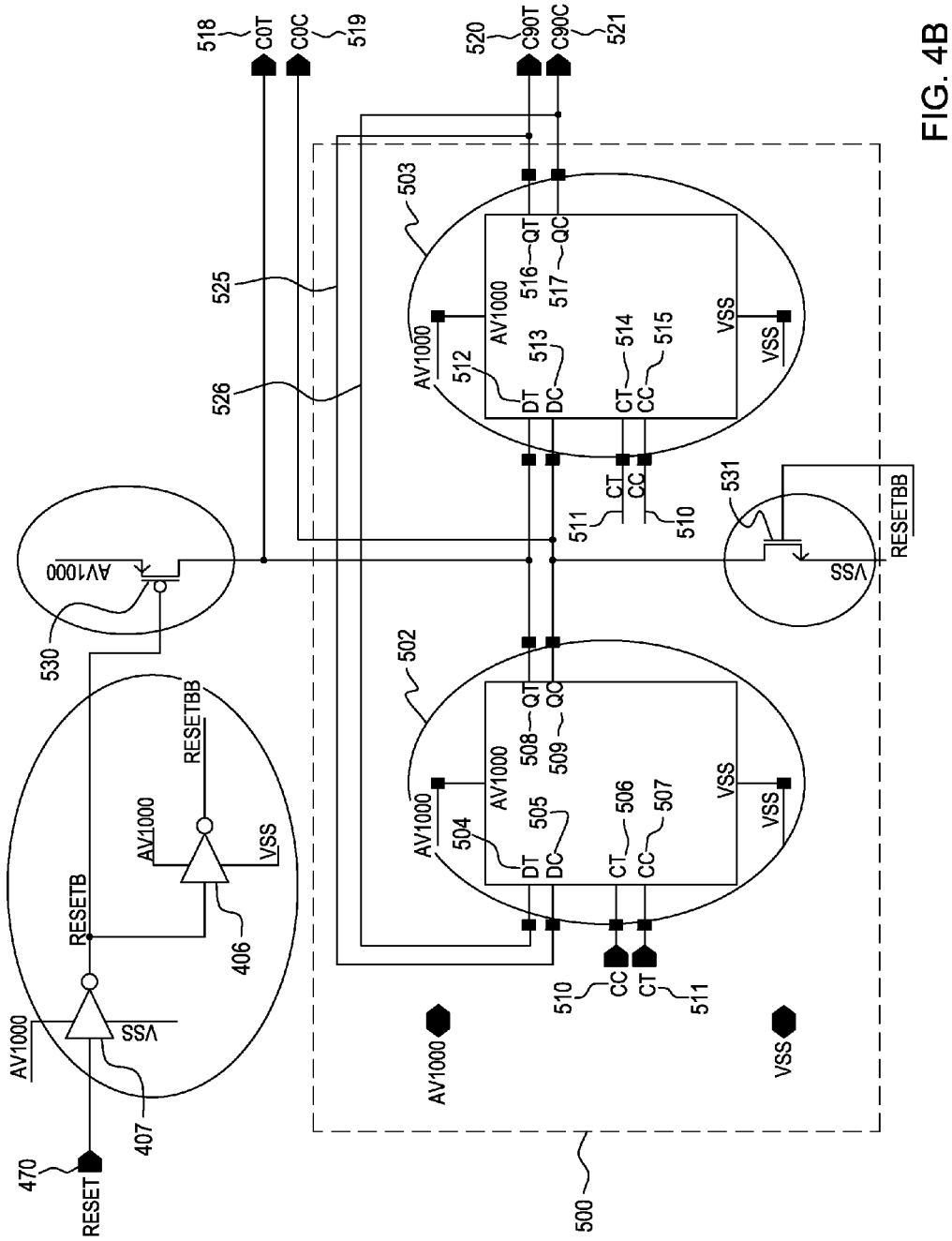

FIG. 4B illustrates a schematic depicting one embodiment of the combinatorial reset logic and tri-state clock mux with pull-up and pull-down devices 400 (shown in FIG. 4A) operatively coupled to divide-by-two quadrature divider 500. The quadrature divider 500 is comprised of a first latch 502 and a second latch 503, Moreover, the combinatorial reset logic and tri-state clock mux with pull-up and pull-down devices 400 are operatively coupled to p-fet pull-up device 530 and n-fet pull-down device 531. Specifically, p-fet pull-up device 530 is connected to data input 512 of the second latch 503, and n-fet pull-down device 531 is connected to data input 513 of the second latch 503. The combinatorial reset logic and tri-state clock mux with pull-up and pull-down devices 400 together with devices 530 and 531, prevent the divide-by-two quadrature divider 500 from entering and remaining in a metastable state at startup or initial settling time when high frequency clock input signals are received at inputs 460-463 (shown in FIG. 4A).

Specifically, the quadrature divider 500 comprises a first latch 502 and a second latch 503. The first latch 502, comprises data inputs 504-505, clock inputs 506-507, and outputs 508-509. The second latch 503 comprises data inputs 512-513, clock inputs 514-515, and outputs 516-517. Outputs 508-509 are connected to data inputs 512-513, respectively. True clock output signal 518 and a complement clock output signal 519, both with a frequency of one-half the frequency of input signals 510-511 are expected to be generated at outputs 508 and 509, respectively. In addition, true clock output signal 520 and complement clock output signal 521, both with a frequency of one-half the frequency of input signals 510-511 are expected to be generated at outputs 516 and 517, respectively. However, clock output signals 520-521 will have a 90 degrees phase difference with respect to clock output signals 518-519.

Furthermore, outputs 516 and 517 are connected to inputs 505 and 504, respectively to form a feedback loop between the first latch 502 and the second latch 503, within the quadrature divider 500. Moreover, data input 512 of second latch 503 is operatively coupled to pull-up device 530, and data input 513 is operatively coupled to pull-down device 531. Logic gate 407 has reset input 470 (also shown in FIG. 4A), and the output of logic gate 407 is connected to the input of logic gate 406 and to the gate of p-fet pull-up device 530. The output of the logic gate 406 is connected to the gate of n-fet pull-down device 531. The outputs 480-481 (shown in FIG. 4A), of the tri-state clock mux comprising circuit components 415-418 (shown in FIG. 4A) provide the clock input signals 510-511 for the first latch 502 and second latch 503. Specifically, clock inputs 507 and 514 receive a true clock input signal 511, whereas clock inputs 506 and 515 receive a complement clock input signal 510.

When reset input 470 is asserted (i.e. set to logic high), the clock mux comprising circuit components 415-418 is tri-stated, and as a result the clock mux does not allow clock input signals received at inputs 460-463 to pass through to the clock mux outputs 480-481. Moreover, when reset input 470 is asserted output 480 is pulled to Vdd by p-fet pull-up device 409, whereas, tri-state clock mux output 481 is pulled to Vss by n-fet pull-down device 408. In addition, when reset input 470 is asserted, clock input 514 of the second latch 503 is set to Vdd and clock input 515 is set to Vss. Also, when reset input 470 is asserted, data input 512 of second latch 503 is pulled to Vdd by p-fet pull-up device 530, and data input 513 of second latch 503 is pulled to Vss by n-fet pull-down device 531. Accordingly, when reset 470 is asserted second latch 503 is in transparent mode, so outputs 516-517 provide a defined logic high (i.e. Vdd) and a logic low (i.e. Vss) state through feedback paths to data inputs 504-505, respectively. In addition, when reset input 470 is asserted first latch 502 is in latch mode, hence outputs 508-509 are isolated from inputs 504-505. Furthermore, when reset input 470 is de-asserted (i.e. Vss), the divide-by-two quadrature divider 500 will not enter and remain in a metastable state.

In alternative embodiments, the p-fet pull-up device 530 and the n-fet pull-down device 531 are optional and can be removed. When reset 470 is asserted, the second latch 503 is in transparent mode with defined logic states for the clock inputs 514-515. The cross-coupled inverters 113-114 (shown in FIG. 1) within second latch 503 will resolve itself and provide a defined logic high (i.e. Vdd) and a defined logic low (i.e. Vss) state for outputs 516-517, since clock inputs 514-515 have valid logic states when reset input 470 is asserted. Thus, outputs 516 and 517 will provide a defined logic state wherein one output is at Vdd and the other output is at Vss, through respective feedback paths 525 and 526, to data inputs 505 and 504, respectively. As a result, when reset 470 is de-asserted, the divide-by-two quadrature divider 500 will not enter and remain in a metastable state.

Figure 5A:
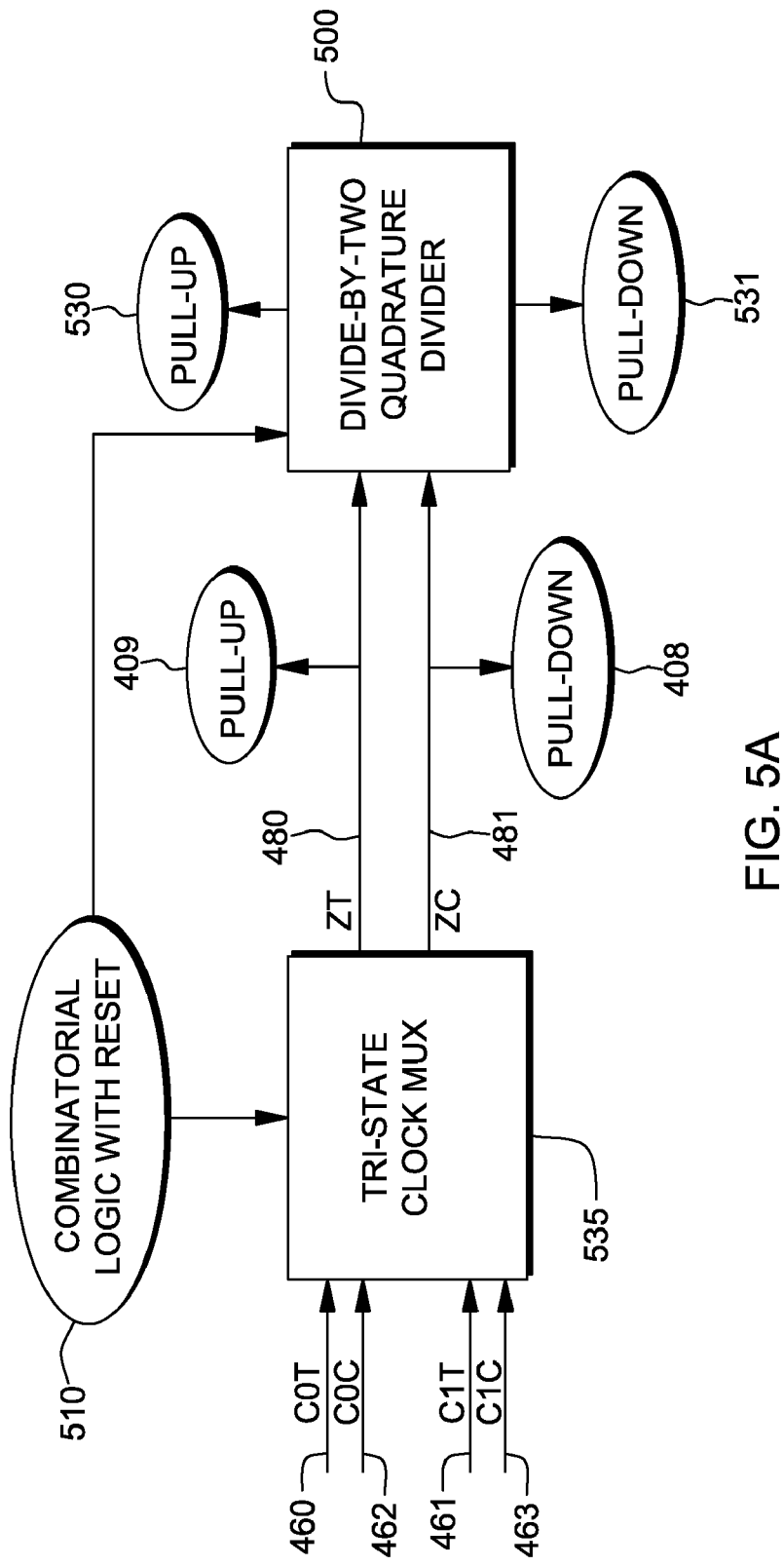
FIGS. 5A-5B are block diagrams of a first embodiment and an alternative embodiment of combinatorial reset logic, and tri-state clock mux with pull-up and pull-down devices operatively coupled to the divide-by-two quadrature divider of FIG. 2, wherein within the first embodiment the quadrature divider comprises its own pull-up and pull-down devices, and wherein within the alternative embodiment the pull-up and pull-down devices of the quadrature divider are removed.

FIG. 5A illustrates a block diagram depicting one embodiment of the invention with combinatorial reset logic 510 operatively coupled to tri-state clock mux 535 and divide-by-two quadrature divider 500 (also shown in FIG. 4B). Tri-state clock mux 535 comprises input pair 460 and 462, input pair 461 and 463, and outputs 480-481 (also shown in FIG. 4A). Outputs 480-481 are connected to pull-up device 409 and pull-down device 408, respectively. In addition, outputs 480-481 are connected to input signals 510-511 (shown in FIG. 4B), respectively, wherein the divide-by-two quadrature divider 500 comprises pull-up device 530 (also shown in FIG. 4B) and pull-down device 531 (also shown in FIG. 4B). In an alternative embodiment, pull-up device 530 and pull-down device 531 can be removed, and outputs of the divide-by-two quadrature divider 500 will still be metastability-free at high frequency signal applications.

Figure 5B:
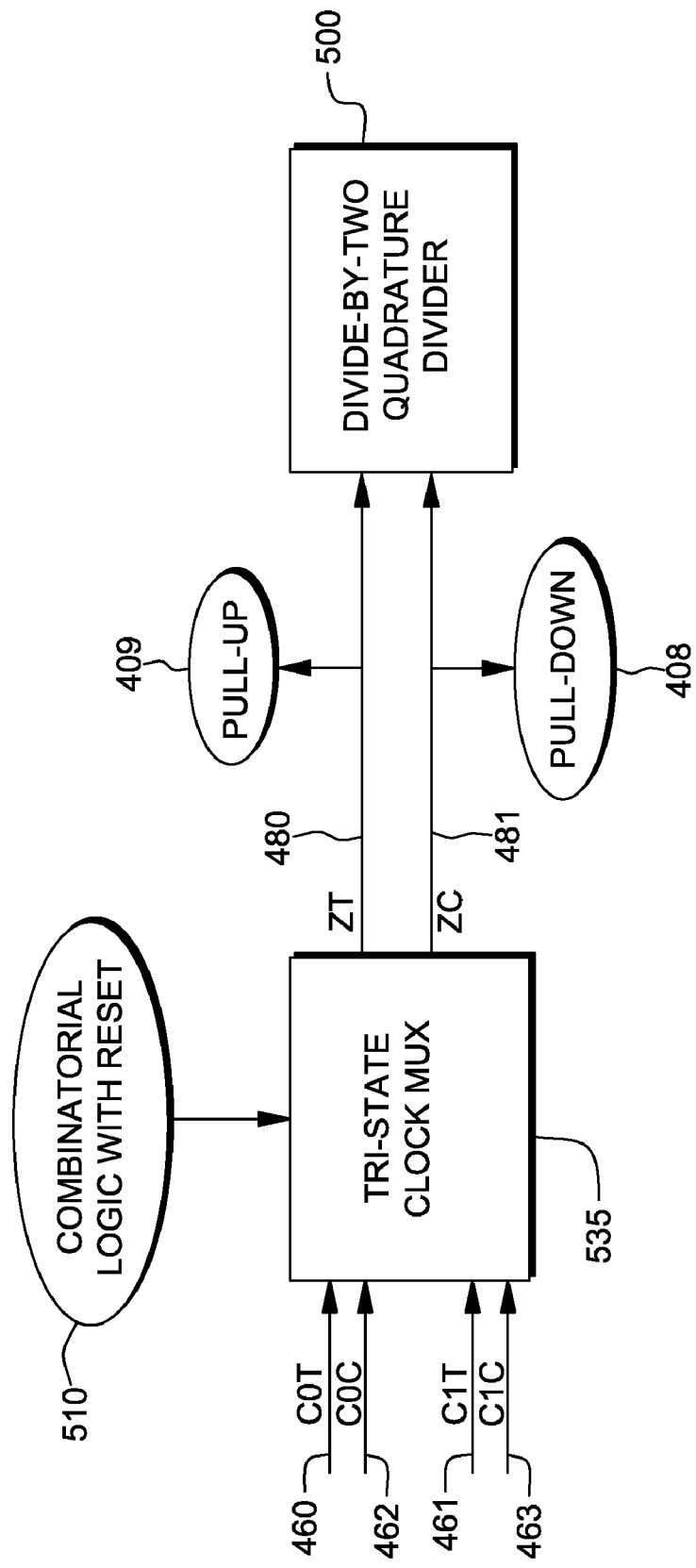

FIG. 5B illustrates a block diagram depicting the alternative embodiment of the invention with combinatorial reset logic 510 operatively coupled to tri-state clock mux 535 and divide-by-two quadrature divider 500 (also shown in FIG. 4B). Tri-state clock mux 535 comprises input pair 460 and 462, input pair 461 and 463, and outputs 480-481 (also shown in FIG. 4A). Outputs 480-481 are connected to pull-up device 409 and pull-down device 408, respectively. In addition, outputs 480-481 are connected to input signals 510-511 (shown in FIG. 4B). However, unlike FIG. 4B and FIG. 5A, the divide-by-two quadrature divider 500 does not comprise pull-up device 530 and pull-down device 531. Nevertheless, the output of the divide-by-two quadrature divider will still be metastability-free at high frequency signal applications.

Figure 6A:
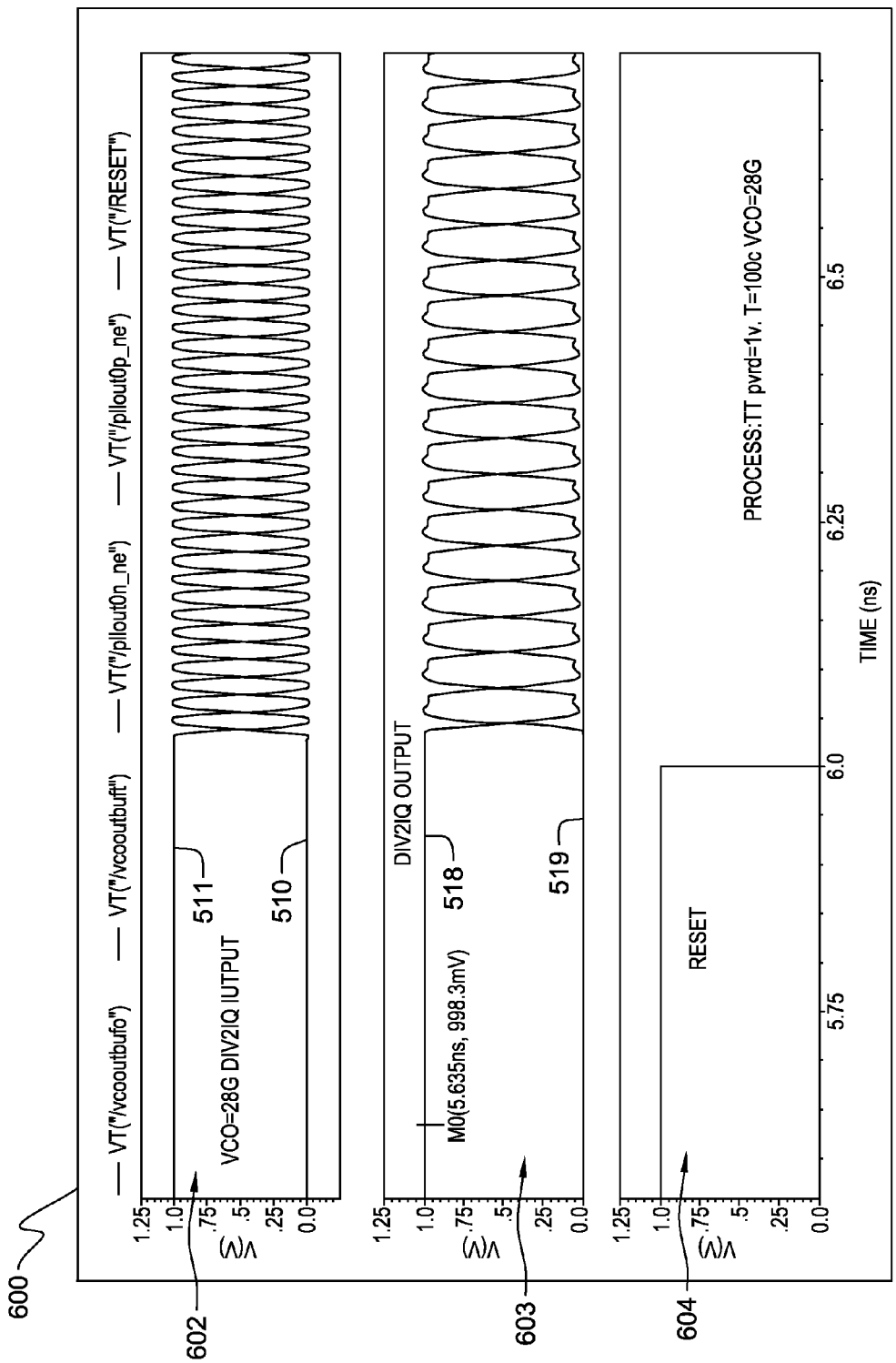
FIGS. 6A-6B are timed simulation diagrams for the one embodiment and an alternative embodiment respectively, depicting the waveform of clock input signals, with a frequency of 28 GHz, received into the divide-by-two quadrature divider of FIG. 2 operatively coupled to the combinatorial reset logic, and tri-state clock mux with pull-up and pull-down devices of FIGS. 4A-4B, and also depicting the waveform of output signals from the divide-by-two quadrature divider of FIG. 2 while the reset logic is asserted and de-asserted.

FIG. 6A illustrates a timed simulation diagram 600 (at 1.0 Volt, 100° C.) depicting bottom waveform 604 of the reset input 470 (shown in FIG. 4B), top waveform 602 of the clock input signals 510-511 (shown in FIG. 4B), and middle waveform 603 of the clock output signals 518-519 (shown in FIG. 4B).

When reset input 470 is asserted (i.e. logic high), at 0 nanoseconds, waveform 604 remains at logic high, and waveform 602 indicates that clock input signal 511 remains at Vdd (i.e. logic high) and clock input signal 510 remains at Vss (i.e logic low). Moreover, when reset input 470 is asserted, waveform 603 indicates that output signal 518 remains at Vdd and output signal 519 remains at Vss.

In addition, when reset input 470 is de-asserted (i.e. at 6.0 nanoseconds), waveform 604 transitions from high to low, tri-state clock mux comprising circuit components 415-418 (shown in FIG. 4A) will pass a selected clock input signal pair to the divide-by-two quadrature divider inputs 506-507 and 514-515 (shown in FIG. 4B). Waveform 602 shows that shortly after reset input 470 is de-asserted (i.e reset input 470 goes from 1.0 Volt to 0 Volt), clock input signals 510-511 start and continue oscillating rail to rail (i.e. between Vdd and Vss) at a frequency of 28 GHz. Moreover, shortly after reset input 470 is de-asserted, clock output signals 518-519 start and continue oscillating rail to rail at a frequency of 14 GHz (i.e. one-half the clock input frequency of 28 GHz). Although, not depicted in FIG. 6A, clock output signals 520-521 (shown in FIG. 4B) also oscillate rail to rail at a frequency of 14 GHz, wherein signals 520-521 have a phase difference of 90 degrees with respect to the outputs 518-519. The waveforms in FIG. 6A indicate that the divide-by-two quadrature divider 500 (shown in FIG. 4B) is functioning correctly and is not entering and remaining in a metastable state. Thus, unlike FIGS. 3C-3E, no metastability occurs when the input frequency is 28 GHz.

Figure 6B:
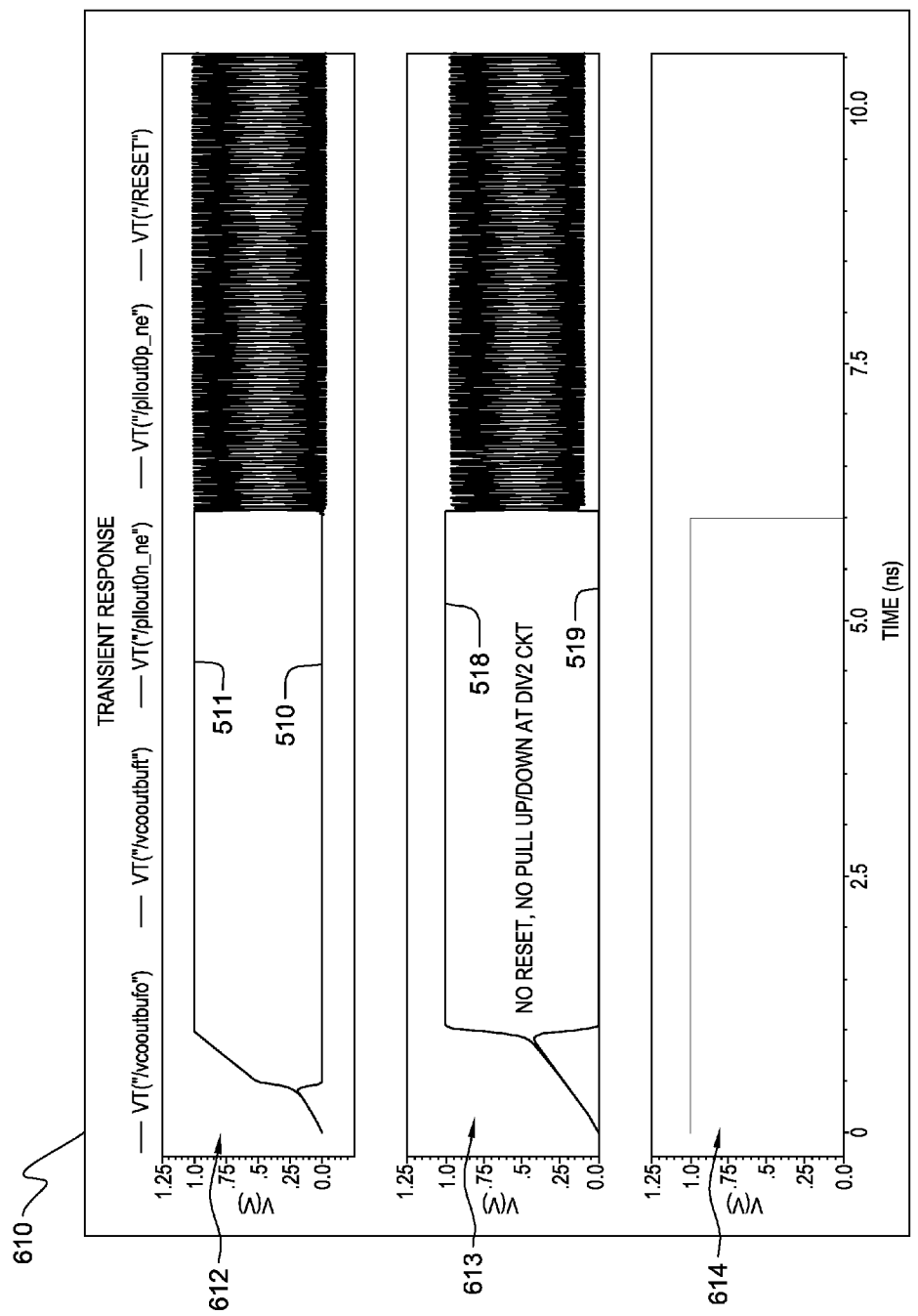

FIG. 6B illustrates a timed simulation diagram 610 (at 1.0 Volt and 100° C.) depicting bottom waveform 614 of the reset input 470 (shown in FIG. 4B), top waveform 612 of the clock input signals 510-511 (shown in FIG. 4B), and middle waveform 613 of the clock output signals 518-519 (shown in FIG. 4B) for the alternative embodiment (i.e. FIG. 5B), wherein the pull-up device 530 (shown in FIG. 4B and FIG. 5A) and pull-down device 531 (shown in FIG. 4B and FIG. 5A) are removed.

When reset input 470 is asserted (i.e. logic high), at 0 nanoseconds, waveform 614 remains at logic high, and waveform 612 indicates that clock input signal 511 remains at Vdd (i.e. logic high) and clock input signal 510 remains at Vss (i.e logic low). Moreover, when reset input 470 is asserted, waveform 613 indicates that output signal 518 remains at Vdd and output signal 519 remains at Vss.

In addition, when reset input 470 is de-asserted (i.e. at 6.0 nanoseconds), waveform 614 transitions from high to low, tri-state clock mux comprising circuit components 415-418 (shown in FIG. 4A) will pass a selected clock input signal pair to the divide-by-two quadrature divider inputs 506-507 and 514-515 (shown in FIG. 4B). Waveform 612 shows that shortly after reset input 470 is de-asserted (i.e reset input 470 goes from 1.0 Volt to 0 Volt), clock input signals 510-511 start and continue oscillating rail to rail (i.e. between Vdd and Vss) at a frequency of 28 GHz. Moreover, shortly after reset input 470 is de-asserted, clock output signals 518-519 start and continue oscillating rail to rail at a frequency of 14 GHz (i.e. one-half the clock input frequency of 28 GHz). Although, not depicted in FIG. 6A, clock output signals 520-521 (shown in FIG. 4B) also oscillate rail to rail at a frequency of 14 GHz, wherein signals 520-521 have a phase difference of 90 degrees with respect to the outputs 518-519. The waveforms in FIG. 6A indicate that the divide-by-two quadrature divider 500 (shown in FIG. 4B) is functioning correctly and is not entering and remaining in a metastable state. Again, unlike FIGS. 3C-3E, no metastability occurs when the input frequency is 28 GHz and the pull-up device 530 and pull-down device 531 are removed.

Figure 7:
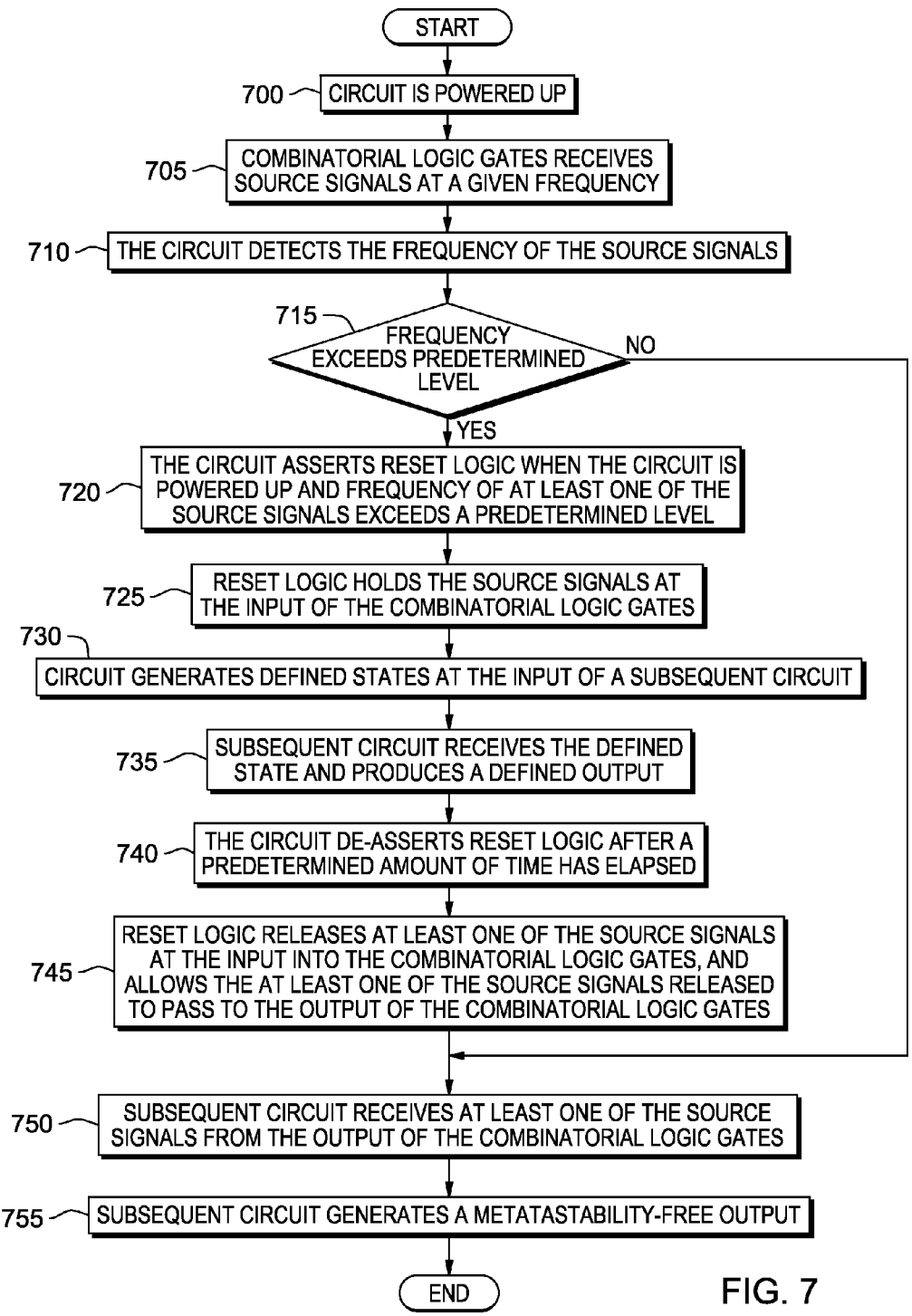
FIG. 7 is a method flow diagram depicting the operation of the integrated circuit according to one embodiment of the present invention.

FIG. 7 depicts a method flow diagram according to one embodiment of the present invention is shown. In step 700, a PLL circuit is powered up. The PLL circuit comprises a subsequent circuit, wherein the subsequent circuit is a divide-by-two quadrature divider 500 (shown in FIG. 4B). In step 705, combinatorial logic gates receive source signals at a given frequency. Next in step 710, The PLL circuit detects the frequency of the source signals. In step 715, if the frequency of at least one of the source signals exceeds a predetermined level, then in step 720 PLL circuit will assert reset logic. Subsequently, in step 725 the reset logic holds the source signals at the input of a tri-state clock mux comprising combinatorial logic gates, and does not allow the source signals to pass to the outputs of the tri-state clock mux. Next in step 730, the PLL circuit utilizes a p-fet pull-up device and n-fet pull-down device to generate a defined state at the input of the divide-by-two quadrature divider 500. In step 735, the quadrature divider 500 receives the defined state and produces a defined output. In step 740, the PLL circuit de-asserts the reset logic after a predetermined amount of time has elapsed. In step 745, after the reset logic has been de-asserted the reset logic releases at least one of the source signals at the input of the tri-state clock mux, comprising combinatorial logic gates, and allows the at least one of the source signals to pass to the output of the tri-state clock mux. In step 750, the divide-by-two quadrature divider 500 receives the at least one of the source signals from the output of the tri-state clock mux. Lastly, in step 755 the quadrature divider generates a metastability-free output, and the process ends.

Alternatively, in step 715 if the frequency of the source signals do not exceed the predetermined level, then PLL circuit operations proceed to step 750, wherein the quadrature divider 500 receives the at least one of the source signals from the output of the tri-state clock mux. Then in step 755, the quadrature divider 500 generates a metastability-free output. In the present embodiment, the subsequent circuit is the divide-by-two quadrate divider 500. However, in alternative embodiments the subsequent circuit may be another circuit that is susceptible to metastability during high frequency applications and when initially powered-on.

The method flow diagram depicted in FIG. 7 illustrates the functionality and operation of possible implementations of integrated circuit components according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, those skilled in the art will note from the above description, that presented herein is a novel apparatus and method for generating a metastability-free output of a divide-by-two quadrature divider with minimal impact on circuit topology and on power consumption.

Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. An integrated circuit comprising:
   a reset input and one or more mux select inputs;
   a combinatorial reset logic comprising one or more inputs and one or more outputs, wherein the one or more inputs of the combinatorial reset logic are operatively coupled with the reset input and with the one or more mux select inputs;
   a tri-state clock mux with a first pair of inputs, a second pair of inputs, a first output, and a second output, wherein the tri-state clock mux is operatively coupled with the one or more outputs of the combinatorial reset logic;
   a divide-by-two quadrature divider comprising one or more outputs, a first clock input pair, a second clock input pair, a first latch with outputs and data inputs, and a second latch with outputs and data inputs, wherein the divide-by-two quadrature divider first and second clock input pairs are operatively coupled with the tri-state clock mux first and second outputs, respectively; and
   a pull-up device and a pull-down device, wherein the pull-up and pull-down devices are operatively coupled with the tri-state clock mux first and second outputs respectively, and wherein the pull-up and pull-down devices are operatively coupled with the first and second clock input pairs of the divide-by-two quadrature divider.

2. The integrated circuit of claim 1, wherein the combinatorial reset logic operates asynchronously.

3. The integrated circuit of claim 1, wherein the pull-up device is a p-fet semiconductor, and the pull-down device is a n-fet semiconductor.

4. The integrated circuit of claim 1, wherein clock input signals at the first or second pair of inputs into the tri-state clock mux are selected based on the combinatorial reset logic, mux select inputs, and the reset input.

5. The integrated circuit of claim 4, wherein:
   responsive to the reset input being asserted, the clock input signals into the tri-state clock mux are prevented from passing to the first and second outputs of the tri-state clock mux;
   the first output of the tri-state clock mux is pulled up to logic high and the second output of the tri-state clock mux is pulled down to logic low; and
   the first and second outputs of the tri-state clock mux generate a defined state for the divide-by-two quadrature divider first and second clock input pairs, respectively.

6. The integrated circuit of claim 4, wherein:
   responsive to the reset input being de-asserted, the tri-state clock mux selects one pair of the clock input signals; and
   the clock input signals at the first or second pair of inputs of the tri-state clock mux are selected and allowed to pass to the tri-state clock mux first and second outputs, and then into the first and second clock input pairs of the divide-by-two quadrature divider.

7. The integrated circuit of claim 1, wherein the divide-by-two quadrature divider comprises a p-fet pull-up device and a n-fet pull-down device, and wherein the p-fet pull-up device and the n-fet pull-down device are operatively coupled to the divide-by-two quadrature divider's second latch data inputs.

8. The integrated circuit of claim 7, wherein the p-fet pull-up device and n-fet pull-down device generate a defined state for the divide-by-two quadrature divider's second latch data inputs.

9. The integrated circuit of claim 8, wherein a defined state is provided at the outputs of the second latch.

10. The integrated circuit of claim 1, wherein the combinatorial reset logic and reset input is static logic which minimizes circuit complexity, and has minimal impact on power consumption.

11. A method for generating a metastability-free output of a divide-by-two quadrature divider circuit, the method comprising the steps of:
    receiving one or more source signals at one or more inputs of combinatorial logic gates;
    detecting a frequency of the one or more source signals;
    asserting reset input when a circuit is powered up and the frequency of at least one of the source signals exceeds a predetermined level;
    utilizing the reset input and combinatorial logic gates to hold the source signals at the input into a second circuit, and preventing the source signals to pass to the outputs of the second circuit;
    generating a defined state at an input of a subsequent circuit;
    receiving the defined state into the subsequent circuit from the output of the second circuit;
    generating a defined state at an output to the subsequent circuit;
    de-asserting the reset input after a predetermined amount of time has elapsed;
    utilizing the reset input and combinatorial logic to release at least one of the source signals at the input into the second circuit, and allowing the source signal to pass to the outputs of the second circuit;
    receiving the source signals from the outputs of the second circuit into the input of the subsequent circuit; and
    generating a metastability-free output at the output of the subsequent circuit.

12. The method of claim 11, wherein the predetermined level is 25 Ghz.

13. The method of claim 11, wherein the second circuit is a tri-state clock mux.

14. The method of claim 11, wherein the combinatorial reset logic is asynchronous with respect to a clock input signal.

15. The method of claim 11, wherein the combinatorial reset logic and reset input is static logic, which minimizes circuit complexity, and has minimal impact on power consumption.

16. The method of claim 11, wherein the subsequent circuit is a divide-by-two quadrature divider, which is susceptible to metastability during startup or initial settling time while operating at a high frequency application.

17. The method claim 16, wherein the divide-by-two quadrature divider comprises a p-fet pull-up device and a n-fet pull-down device.

18. The method claim 17, wherein the p-fet pull-up device and the n-fet pull-down device are operatively coupled to the divide-by-two quadrature divider's second latch data inputs.

19. The method of claim 17, wherein the defined state generated at the input of the divide-by-two quadrature divider is achieved by utilizing a p-fet pull-up device and n-fet pull-down device.

* * * * *